United States Patent
Ayoub et al.

(10) Patent No.: US 10,846,163 B1
(45) Date of Patent: *Nov. 24, 2020

(54) HYBRID HARDWARE AND SOFTWARE REPORTING MANAGEMENT

(71) Applicant: Amazon Technologies, Inc., Seattle, WA (US)

(72) Inventors: Hani Ayoub, Majd al-Krum (IL); Adi Habusha, Moshav Alonei Abba (IL); Itay Poleg, Yuvalim (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,125

(22) Filed: Jul. 19, 2019

Related U.S. Application Data

(63) Continuation of application No. 15/597,987, filed on May 17, 2017, now Pat. No. 10,360,092.

(51) Int. Cl.
  *G06F 11/07* (2006.01)
  *H03M 13/00* (2006.01)

(52) U.S. Cl.
  CPC ...... *G06F 11/0784* (2013.01); *G06F 11/0745* (2013.01)

(58) Field of Classification Search
  CPC .................. G06F 13/105; G06F 13/24; G06F 2213/0058; G06F 9/5077; G06F 2213/0026; G06F 13/4282
  See application file for complete search history.

(56) References Cited

U.S. PATENT DOCUMENTS

| 10,360,092 B1* | 7/2019 | Ayoub | G06F 11/0784 |
| 2011/0041105 A1* | 2/2011 | Chou | G06F 13/28 716/106 |
| 2011/0185103 A1 | 7/2011 | Evoy et al. | |
| 2011/0296256 A1 | 12/2011 | Watkins et al. | |

(Continued)

OTHER PUBLICATIONS

U.S. Appl. No. 15/597,987, "Non-Final Office Action," dated Nov. 20, 2018, 10 pages.

(Continued)

*Primary Examiner* — Guy J Lamarre
(74) *Attorney, Agent, or Firm* — Kilpatrick Townsend & Stockton LLP

(57) ABSTRACT

Described herein is a hybrid approach to error reporting, using a combination of hardware and software, for peripheral component interconnect (PCI) express devices. The device hardware detects an error on a packet, where the packet is for a transaction and received from a host computer. Upon detecting the error, the device hardware generates an interrupt that is processed in software. In certain embodiments, the software based processing involves determining, based on the packet, that the transaction is directed to an address space of an emulated configuration register. The software based processing further involves identifying a function as being associated with the error, determining attributes associated with the error, and storing the attributes and an identifier associated with the function in a location available to the device hardware, thereby enabling the device hardware to report the attributes and identifier to the host computer.

20 Claims, 11 Drawing Sheets

(56) References Cited

U.S. PATENT DOCUMENTS

2016/0098365 A1* 4/2016 Bshara ................. G06F 13/105
  710/104
2016/0380694 A1  12/2016 Guduru
2017/0177528 A1  6/2017 Harriman et al.

OTHER PUBLICATIONS

U.S. Appl. No. 15/597,987, "Notice of Allowance," dated Mar. 12, 2019, 6 pages.
PCI Express , "PCI Express Base Specification", Revision 3.0, PCI-SIG®, Nov. 10, 2010, 860 pages.
Zhang et al., "Enable PCI Express Advanced Error Reporting in the Kernel", Proceedings of the Linux Symposium, vol. 2, Ottawa, Ontario, Jun. 27-30, 2007, pp. 297-304.

* cited by examiner

HYBRID HARDWARE AND SOFTWARE REPORTING MANAGEMENT

CROSS REFERENCE TO RELATED APPLICATIONS

This application is a continuation of U.S. Non-Provisional patent application Ser. No. 15/597,987, filed May 17, 2017, and entitled "HYBRID HARDWARE AND SOFTWARE REPORTING MANAGEMENT," the content of which is herein incorporated by reference in its entirety.

BACKGROUND

In certain systems, error reporting to a host computer by a device may be performed by device hardware. For example, the device hardware may expose the error type and the severity using peripheral component interconnect (PCI) express and advanced error reporting (AER) capabilities. However, such error reporting by the device hardware may not provide flexibility or scalability. For example, any changes in the device for feature upgrades, bug fixes, etc. may require a re-spin of the device hardware and may come at the cost of additional time and money.

BRIEF DESCRIPTION OF THE DRAWINGS

Various embodiments in accordance with the present disclosure will be described with reference to the drawings, in which.

DETAILED DESCRIPTION

Figure 1:
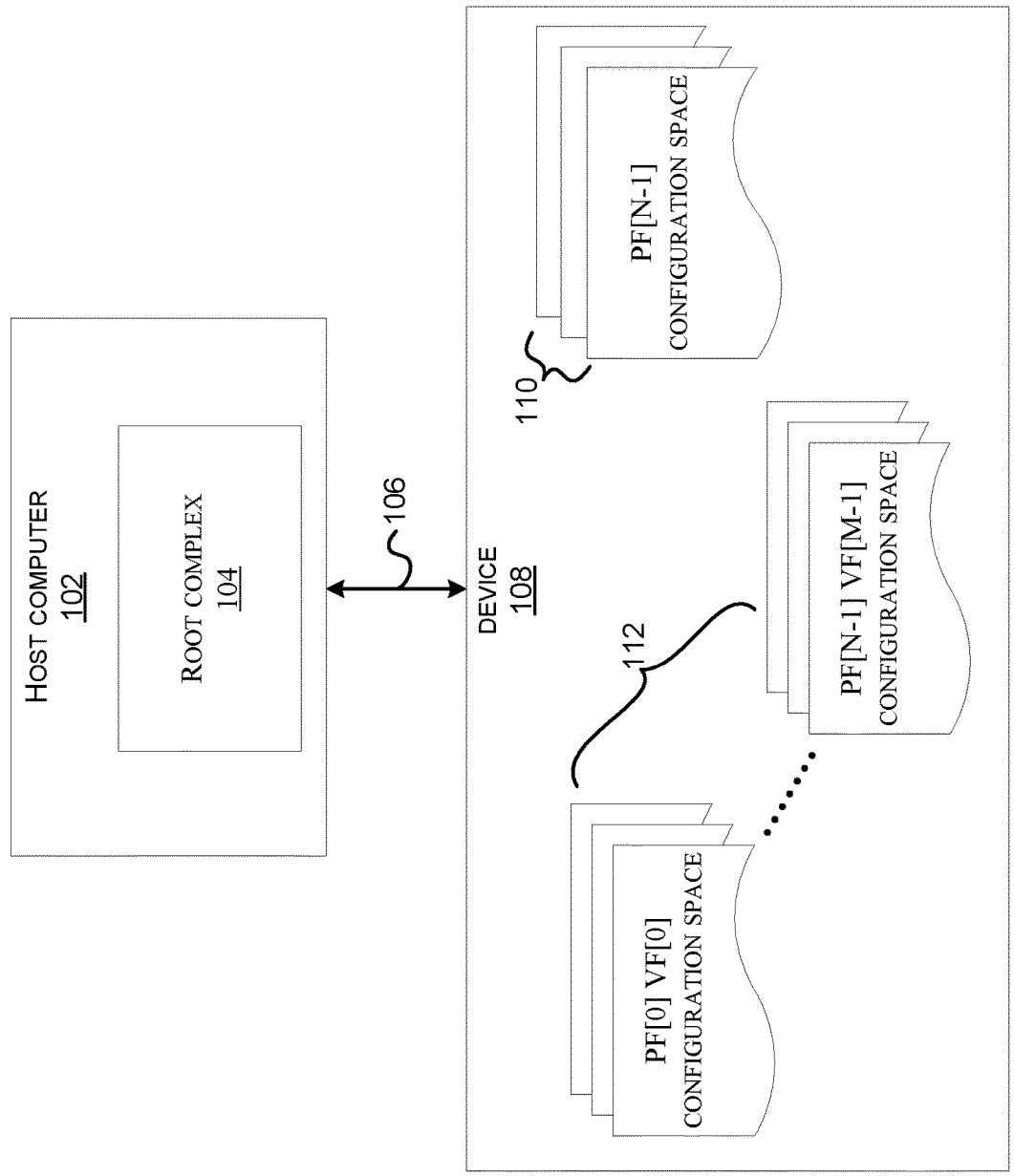
FIG. 1 illustrates a logical diagram of an apparatus comprising a host computer and a device.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

In a server system, a host computer may be coupled to a device using a host interface, e.g., a peripheral component interconnect (PCI) express interface. The device may include a network interface card, sound card, video card, storage device, etc. In some instances, the device may be exposed as a PCI express device to the host computer using a PCI express configuration space. The device may be capable of exposing multiple physical functions (PFs) to the host computer using the PCI express interface. Furthermore, each PF may be capable of exposing multiple virtual functions (VFs) to the host computer in a virtualized environment. Generally, such devices can support PCI express capability and advanced error reporting (AER) capability for reporting of errors using the configuration space. In some instances, the device hardware may use these capabilities to expose various error attributes for an error. For example, the device hardware may send an error type and severity of the error in a message to the host computer. However, implementing the AER capabilities in hardware may be complex and may not be cost effective. In addition, as the number of functions implemented by the device changes, such reporting by the hardware may not be scalable without modifying the hardware. For example, addition of VFs implemented by the device, configuration changes, feature upgrades or bug fixes, etc., may require a re-spin of the device hardware resulting in additional costs and time.

Embodiments of the disclosed technologies can provide a hybrid approach for report management by a device using both device hardware and device software. The device may be coupled to a host computer using a host interface. The host interface may utilize any suitable bus protocol, e.g., PCI express, industry standard architecture (ISA), extended industry standard architecture (EISA), video electronics standards association (VESA), accelerated graphics port (AGP), serial advanced technology attachment (SATA), universal serial bus (USB), etc. The host computer may be configured to send a packet for a transaction to the device using the host interface. The packet may include a packet header and a payload. For example, the packet header is the information associated with the packet. In some embodiments, the packet may include a transaction layer packet (TLP). The device hardware may be configured to generate an interrupt for the transaction and send the interrupt to the device firmware. The device firmware may include software executed on the device and can be used interchangeably with the device software. According to the embodiments, the device software can determine certain attributes associated with the transaction that caused the interrupt and identify an owner associated with the transaction. For example, the owner may be a software component associated with the transaction, such as a function or a process, which can be a requester or a completer of the transaction. The device software can log the attributes and an identifier associated with the owner. The device hardware can report the attributes and the identifier associated with the owner to the host computer via the host interface. Thus, according to the embodiments, the device hardware and the device software in collaboration with each other can provide a hybrid approach for report management. Such a hybrid approach may provide flexibility and ease of use as compared to hardware only approach for report management.

In some instances, the device hardware may detect an error on the transaction. For example, the device may be coupled to the host computer using a PCI express interface. The device may be capable of exposing multiple physical functions (PFs) or virtual functions (VFs) to the host computer using its PCI express configuration space. For example, each function may be an addressable entity in the PCI express configuration space. In some embodiments, the device hardware may perform a first level of error classification based on the protocol layer and may generate an interrupt for the transaction upon detecting the error. In certain embodiments of the disclosed technologies, the device software can determine a current state of the device upon receiving the interrupt from the device hardware. If the current state of the device does not allow error processing, the device software may ignore the error completely or may process the error at a later point in time. If the current state of the device allows error processing, the device software can identify an owner associated with the error based on the packet header. For example, the owner may be a VF or a PF associated with the error. The device software may perform a second level of error classification and can determine various attributes associated with the error. For example, the various attributes may include a type of the error (e.g., correctable or uncorrectable) and severity of the error (e.g., fatal or nonfatal). In certain embodiments, the device software may be configured to expose the attributes and the identifier associated with the function in PCI express capability and/or advanced error reporting (AER) capability for the function using the PCI express configuration space. The device hardware can report the various attributes and the identifier associated with the function determined by the device software in a message to the host computer. For example, the message may include a TLP message. The host computer may receive the error message from the device and may associate the error to a fault function associated with a hypervisor executing on the host computer.

FIG. 1 illustrates a logical diagram of an apparatus 100 comprising a host computer 102 and a device 108. In some embodiments, the apparatus 100 may be part of a server computer. For example, the server computer may be used to provide services such as cloud computing, analytics, web services, storage, databases, applications, deployment services, etc. to client computers. The device 108 may include a network interface card (NIC), sound card, video card, storage device (e.g., serial advanced technology attachment (SATA) drive, solid state drive (SSD)), etc. The device 108 may be coupled to the host computer 102 using a host interface 106. For example, the host interface 106 may include a PCI express interface. It will be understood that even though some embodiments of the disclosed technologies will be discussed using the PCI express protocol, the embodiments can support other bus protocols, e.g., SATA, universal serial bus (USB), ISA, EISA, VESA, AGP, etc., without deviating from the scope of the disclosed technologies.

The host computer 102 may include a root complex 104. The root complex 104 may connect a processor and memory subsystem of the host computer 102 to switches or PCI express endpoints. For example, the device 108 may function as a PCI express endpoint which may communicate directly with the root complex 104 or through a switch. In some implementations, the root complex 104, switches and the endpoints may be part of a PCI express switch fabric which may be configured by the root complex 104. For example, the root complex 104 may be responsible to generate a transaction on behalf of the processor of the host computer 102 to configure, write or read from the device 108. In some implementations, the root complex 104 may be part of the processor on the host computer 102.

The device 108 may include configuration spaces 110 and 112. Generally, the configuration space, also called PCI express configuration space, may include a set of registers that may be memory mapped to an address space in the host computer 102. For example, the set of registers may include a base address register (BAR) which may specify a base address for a region of memory assigned to that address space. The configuration space may be configured by the root complex 104 using a configuration space address specific to the device 108. In some instances, the configuration spaces for the device 108 may include capabilities supported by the device 108. For example, the device 108 may be capable of exposing multiple physical functions {PF[0], PF[1], . . . , PF[N−1]} using the configuration space 110 and multiple virtual functions {VF[0], VF[1], . . . , VF[M−1]} using the configuration space 112. The configuration space 110 may include configuration spaces for all the physical functions PF[0], PF[1], . . . , PF[N−1] supported by the device 108. In some implementations, the configuration space 110 can be implemented as hardware registers or can be emulated in software. A PF may represent a PCI express device with single root input output virtualization (SR-IOV) capability. The SR-IOV capability can enable a single root function (e.g., a single Ethernet port) to appear as multiple, separate, physical devices. A physical device with the SR-IOV capability can be configured to appear in the PCI configuration space as multiple functions. The PFs can configure and manage the SRIOV functionality by assigning virtual functions. In some implementations, each of the PF[0], PF[1], . . . , PF[N−1] may be capable of exposing virtual functions {VF[0], VF[1], . . . , VF[M−1]} using the configuration space 112, e.g., {PF[0] VF[0], . . . , PF[N−1] VF[M−1]}, where N and M are positive integers. For example, the configuration space 112 may include configuration spaces for each of the virtual functions {PF[0] VF[0], . . . , PF[N−1] VF[M−1]} supported by the device 108. In some implementations, each device function on the PCI express bus can be addressable using an eight-bit PCI bus, five-bit device, and three-bit function numbers for the device (also referred to as the bus/device/function, BDF or B/D/F). In some embodiments, each PF or VF may be capable of exposing PCI express capability and advanced error reporting (AER) capability using their respective PCI express configuration space. For example, for a given function, the PCI express capability can allow access to the device control and status registers, and the AER capability can allow access to the device status, mask and severity registers among other registers. In some implementations, the configuration space 112 can be emulated in software.

Figure 2:
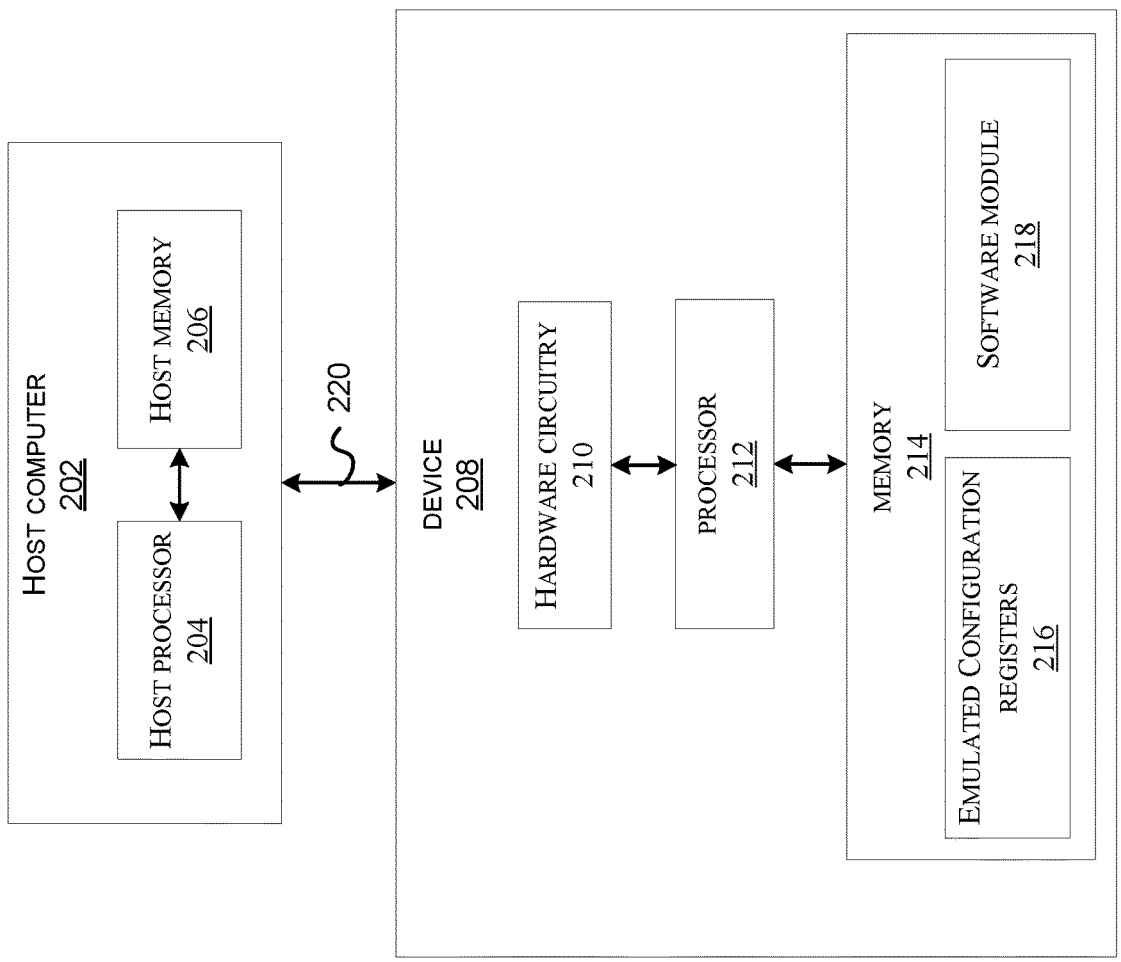
FIG. 2 illustrates a block diagram of an apparatus comprising a host computer and a device, in one embodiment of the disclosed technologies.

FIG. 2 illustrates a block diagram of an apparatus 200 comprising a host computer 202 and a device 208, in one embodiment. The apparatus 200 may be similar to the apparatus 100 as discussed with reference to FIG. 1.

The host computer 202 may include a host processor 204, and a host memory 206 coupled to the host processor 204. In some implementations, functionality of a root complex, e.g., the root complex 104, as discussed with reference to FIG. 1, may be integrated with the host processor 204. In some other implementations, the host computer 202 may include the root complex as a discrete component which may be communicatively coupled to the host processor 204 and to the host memory 206. The host memory 206 may include RAM, ROM, Electrically Erasable Programmable Read-Only Memory (EEPROM), flash memory or any suitable storage media. In some instances, the host computer 202 may include an x86 CPU platform, e.g., Xeon, Pentium, Atom, Athlon, etc. The host processor 204 may be configured to execute a hypervisor or a virtual machine manager (VMM) on the host computer 202. The hypervisor can emulate a single device as multiple virtual devices in a virtualized environment. For example, the hypervisor may be configured to create and manage one or more virtual machines or functions on the host computer 202. A virtual machine may be any suitable emulation of a computer system. In some instances, the hypervisor may initiate a transaction which may be directed to an address space associated with the one of the PFs or VFs implemented by the device 208.

The device 208 may be communicatively coupled to the host computer 202 via a host interface 220. For example, the host interface 220 may include a PCI express interface. In some implementations, the device 208 may include hardware circuitry 210 communicatively coupled to a processor 212. The processor 212 may be communicatively coupled to memory 214. The memory 214 may include emulated configuration registers 216 and a software module 218. Even though the embodiments have been discussed using the PCI express protocol, it will be noted that the device 208 can implement any bus protocol, e.g., PCI, industry standard architecture (ISA), extended ISA (EISA), multi-channel, USB, SATA, etc., without deviating from the scope of the disclosed technologies. In some embodiments, the device 208 may be an SR-IOV compliant device, which can allow the device 208 to appear to be multiple physical PCI express devices to the host computer 202. Using the SRI-OV capability, the device 208 can implement multiple PFs or VFs in a virtualized environment.

The hardware circuitry 210 may be configured to receive a packet for a transaction from the host computer 202 via the host interface 220. In some embodiments, the packet may include a transaction layer packet (TLP). The PCI express protocol may be implemented in the transaction layer, the data link layer and the physical layer of the open systems interconnection (OSI) model layers. For example, a packet may be created by the transaction layer and may be appended by the data link layer and the physical layer for transmission between a requester and a completer. In some embodiments, the requester or the completer can initiate a transaction and can alternatively be called an owner of the transaction. The PCI express protocol can support memory transactions, input/output (I/O) transactions, configuration transactions and message transactions that originate at the transaction layer. Configuration transactions can be used by the root complex to configure the system upon power-up. Message transactions can be used to send interrupts and error conditions, as well as other information through the PCI express fabric.

The hardware circuitry 210 may include physical configuration registers for the device 208. For example, the physical configuration registers may include base address registers (BARs) and other relevant configuration registers. The host processor 204 (or the root complex) may perform write transactions to the configuration registers to configure or control the device 208. The host processor 204 may perform read transactions to the configuration registers to identify the type and capabilities of the device 208. In some embodiments, the hardware circuitry 210 may be configured to detect an error associated with the transaction and to generate an interrupt upon detecting the error. The hardware circuitry 210 may be configured to perform a first level of error classification based on a protocol layer. In one implementation, the hardware circuitry 210 may classify the error based on the PCI express protocol layer the error corresponds to, e.g., physical layer (PHY), data link layer (DL), transaction layer (TL) or media access control (MAC) layer. The TL is the upper layer where the packet is formed. Some non-limiting examples of the TL errors may include malformed TLP, unsupported requests, data corruption, end-to-end cyclical redundancy check (ECRC) check failure, receiver overflow, unexpected completion, etc. The DL layer is the middle layer which can sequence the packets that are generated by the transaction layer. Some non-limiting examples of the DL layer errors may include data link layer protocol errors, replay time-out, sequence number check for TLPs, link cyclical redundancy check (LCRC) failure for TLPs, etc. The PHY layer is responsible for link training and transaction handling at the interface level. Some non-limiting examples of the PHY layer errors may include receiver errors, link errors, etc. In some implementations, the MAC layer may be a sublayer of the PHY layer.

In some embodiments, the memory 214 may include static random access memory (SRAM), dynamic random access memory (DRAM), synchronous DRAM (SDRAM), double data rate (DDR) SDRAM, read only memory (ROM), electrically erasable programmable read-only memory (EEPROM), flash memory or other memory technology, compact disc (CD)-ROM, or any other medium which can be used to store the desired information and which can be accessed by the processor 212. In some implementations, the software module 218 may include computer readable medium comprising instructions that can be executed by the processor 212 to implement certain functionalities. The computer readable medium may be non-transitory. Some embodiments of the disclosed technologies can support live updates of the firmware. For example, the live update may allow upgrading or changing the software module 218 dynamically or during run time.

The emulated configuration registers 216 may be used to provide configuration space for any number of PFs or VFs implemented by the device 208. For example, the emulated configuration registers 216 may include BARs and other relevant configuration registers emulated in the memory. In some implementations, each function may include its own set of configuration registers. For example, the emulated configuration registers 216 may be part of the configuration space 110 or 112 as discussed with reference to FIG. 1. In some implementations, the emulated configuration registers 216 may include PCI express extended capability registers. For example, the emulated configuration registers 216 may include Advanced Error Reporting (AER) capability registers and other extended capability registers. In some implementations, the emulated configuration registers 216 may be part of the firmware. Some embodiments can allow live updates of the emulated configuration registers 216, e.g., the emulated configuration registers 216 can be dynamically replaced and/or modified. For example, the PCI express extended capabilities may be added or removed in the emulated configuration registers 216. In some implementations, the device 208 may include multiple emulated configuration spaces suitable for different virtual machines, different operating systems, and/or different device types. The emulated configuration registers 216 may be stored in the memory 214 as a text file, source code, object code, as a script, and/or in some other format that is readable by the device 208.

The processor 212 may be configured to receive the interrupt from the hardware circuitry 210 and use interrupt handling mechanisms by the processor 212 to handle the interrupt received at the processor 212 using the software module 218. The instructions from the software module 218 may be configured to determine a current state of the device. For example, the current state of the device may be determined by reading one or more registers in the device. The instructions from the software module 218 may be further configured to identify an owner associated with the transaction. In some embodiments, based on the current state of the device (e.g., not busy), the instructions from the software module 218 may read the packet header for the transaction to identify the owner associated with the transaction. For example, the packet header for the transaction may be logged in a register, e.g., a packet header register. The packet header register may be an internal or proprietary register that may not be exposed to the host processor 204 using the PCI express configuration space. In some implementations, the owner may be a PF or a VF exposed using the configuration space 110 or 112. The instructions executing on the processor 212 from the software module 218 may be further configured to determine attributes associated with the transaction that caused the interrupt. In some implementations, the attributes may identify a cause of the interrupt. For example, in some instances, the cause of the interrupt may be an error associated with the transaction. The attributes may include a type of the error and severity of the error. In some instances, the attributes may further include a classification of the error based on the protocol layer. According to some embodiments, the software module 218 may be further configured to store the attributes and to store an identifier associated with the function. For examples, the software module 218 may expose the attributes and the identifier associated with the function in both the PCI express and the AER capabilities for the given PF or VF. In some embodiments, the PCI express and the AER capabilities for the given PF or VF may be implemented using the emulated configuration registers 216 that can be dynamically modified. In some instances, if the device state indicates a specific state (e.g., a busy state), the software module 218 may completely ignore the error or process the error at a later point in time.

The hardware circuitry 210 may be further configured to report the attributes and to report the identifier associated with the owner to the host computer 202 via the host interface 220. For example, the hardware circuitry 210 may report the attributes and the identifier associated with the function to the host computer 202 using a TLP message transaction. Thus, the embodiments of the disclosed technologies can provide more flexibility by using a hybrid approach for report management as compared to a hardware only approach. Furthermore, using the hybrid approach, the embodiments can allow error reporting associated with the VFs as compared to error reporting that may be limited to only PFs using hardware only approach. In addition, the report management using this hybrid approach can be scaled to any number of VFs without modifying the device hardware. For example, use of the emulated configuration registers 216 implemented in the memory 214 can allow flexibility in exposing the PCI express error capabilities or the AER capabilities for any number of VFs. Further, some embodiments can be used for hybrid hardware and software reporting of other functionalities, e.g., power management, without deviating from the scope of the disclosed technologies. For example, some embodiments of the disclosed technologies can be used to enable the device software to assist with classification of power level states for each emulated function once the device hardware implements transitions of actual hardware states as instructed by the firmware.

Figure 3:
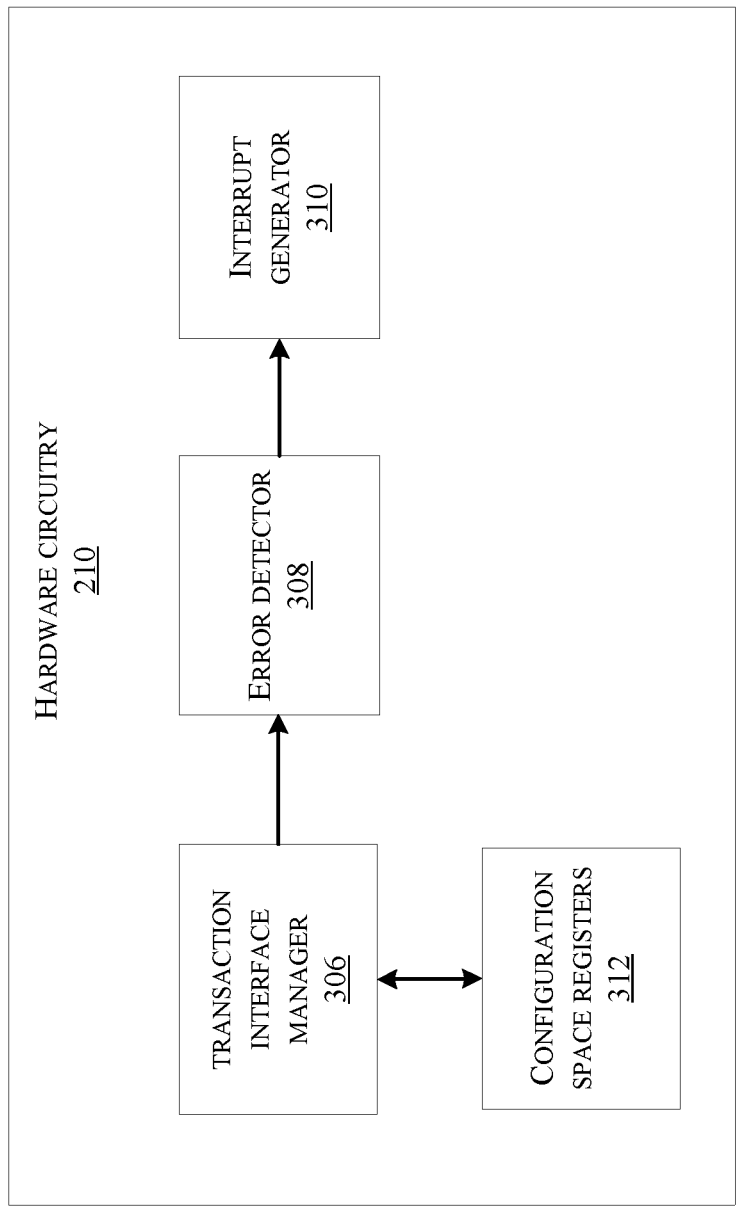
FIG. 3 illustrates a block diagram of hardware circuitry of the device, in one embodiment of the disclosed technologies.

FIG. 3 illustrates a block diagram of the hardware circuitry 210 of the device 208, in one embodiment. The hardware circuitry 210 may include a transaction interface manager 306, an error detector 308, an interrupt generator 310 and configuration space registers 312. Note that the block diagram as shown in FIG. 3 is for illustrative purposes only, and the hardware circuitry 210 may include more or fewer components than shown in FIG. 3 without deviating from the scope of the disclosed technologies.

The transaction interface manager 306 may be configured to communicate with the host computer 202 for a transaction using the host interface 220. The transaction may include a memory transaction, a configuration transaction or a message transaction. For example, the transaction interface manager 306 may receive a packet from the host processor 204 for a read or a write transaction. The transaction may be initiated by a hypervisor running on the host processor 204 and may be directed to an address space associated with one of the PFs or VFs implemented by the device 208. The transaction interface manager 306 may be configured to determine a type of the transaction and a destination for the transaction, i.e., where the transaction is directed to. For example, the memory transaction may include a write or a read transaction to a memory address associated with a VF or a PF. The configuration transaction may include a write or a read transaction to the configuration space registers 312, or to the emulated configuration registers 216 in the memory 214. In some embodiments, the transaction interface manager 306 may include a buffer (not shown) to log the incoming transaction until the hardware circuitry 210 is available to process the transaction. The packet may include a packet header and a packet payload. An example transaction layer packet (TLP) is shown in FIG. 5A.

Figure 5A:
FIG. 5A illustrates an example of a transaction layer packet (TLP), in one embodiment of the disclosed technologies.

FIG. 5A illustrates a transaction layer packet (TLP) 500 in one embodiment. The TLP 500 may include a TLP header 502 and a data payload 504. The TLP header 502 may include information associated with the TLP 500 that may be at the beginning of the TLP 500, end of the TLP 500 or spread across the TLP 500 without deviating from the scope of the disclosed technologies. In some implementations, the TLP 500 may optionally include an end-to-end cyclic redundancy check (ECRC) field (not shown) appended to the data payload 504. In some implementations, a link CRC (LCRC) and a sequence number may be appended by the data link layer to the TLP packet 500 to provide a data link layer packet (DLLP). The TLP 500 may be used to transfer information between a requester and a completer. For example, the TLP 500 may be used to perform a read or a write transaction to a memory mapped location or an I/O mapped location. Based on the type of the transaction (e.g., read request, write request, completion, message request, etc.), configuration of various fields of the TLP header 502 may vary. In some implementations, the TLP header 502 may include three or four double words (e.g., DW0, DW1, DW2, DW3), where each DW can be 32 bits (i.e., four bytes). An example TLP header is described with reference to FIG. 5B.

Figure 5B:
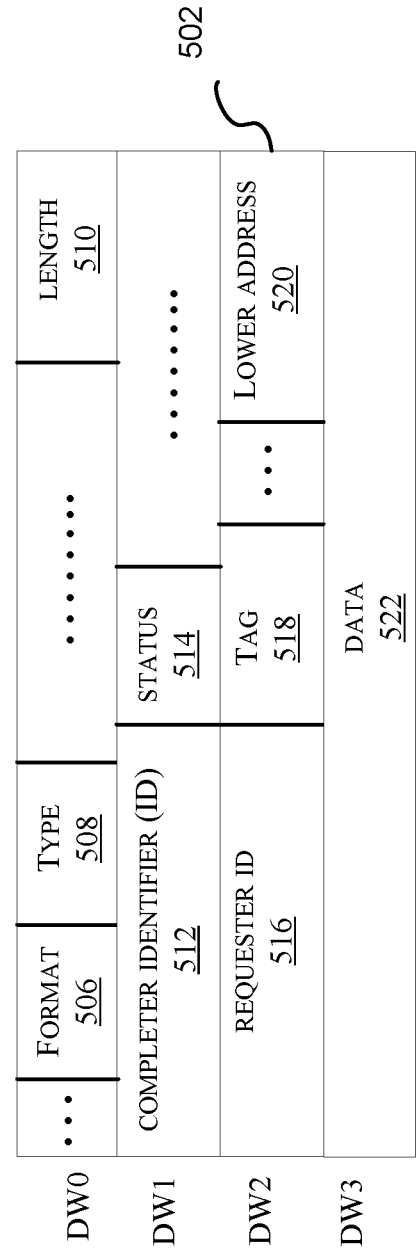
FIG. 5B illustrates an example TLP header for a transaction, in one embodiment of the disclosed technologies.

FIG. 5B illustrates an example TLP header 502 for a transaction, in one embodiment. The TLP header 502 may include a plurality of fields including fields such as a format 506 and a type 508 and several others. A length 510 field may indicate length of the data payload 504. In some instances, the length 510 field may be reserved, e.g., for message transactions or certain completion transactions.

Configuration of some of the fields may be based on the format 506 and the type 508. For example, the format 506 may provide information on the size of the TLP header 502 and whether the TLP 500 includes the data payload 504 following the TLP header 502. The type 508 may provide information on whether the transaction is for a request, for a completion, or for another type of transaction. The requester may be a function that can initiate a transaction in the PCI express domain. The request may include a read or a write request for a memory transaction, an I/O transaction or a configuration transaction. For example, the processor 204 may support generation of the configuration transaction as a requester to configure or setup a device function on the device 208. In some embodiments, the request may include a message transaction for an event signaling or general purpose messaging by the device 208. For example, the message transaction may be used to report an error associated with a transaction by sending a TLP message to the host processor 204 when the error is detected by the hardware circuitry 210. In some instances, the device 208 may implement a type of function that can be a completer of the configuration transaction or the memory transaction. For example, a completion transaction may be used by the device 208 to return read data or to acknowledge completion of a configuration write transaction.

A completer identifier (ID) 512 field may be used to identify a completer of the transaction request. In some implementations, the completer ID 512 may include a completer's bus number, device number and a function number. A status 514 field may indicate the status for a completion. For example, the status 514 may indicate successful completion, unsupported request, completer abort, or other suitable completion status. In some instances, a memory transaction, an I/O transaction or a configuration transaction may include a requester ID 516 and a tag 518. The requester ID 516 may include a requester's bus number, device number and a function number that can be used to identify the requester. The requester ID 516 can be unique for each PCI express function, and together with the tag 518 can provide a transaction ID for each transaction. A lower address 520 field may include lower bits of the memory address. Data 522 field may include data for the transaction, e.g., read data. It will be understood that the TLP header 502 may include other fields which are not shown in FIG. 5B for the purposes of simplicity.

Referring back to FIG. 3, the error detector 308 may be configured to detect an error associated with the transaction. Some common errors may include malformed TLP error, corrupted or poisoned data error, end-to-end cyclical redundancy check (ECRC) error, completion transaction error, etc. In some instances, the malformed TLP may result from the data payload 504 exceeding maximum payload size or due to discrepancy between actual data length and the data length 510 specified in the TLP header 502. The completion transaction error may include unsupported request error, unexpected completion, completion time-out, etc. In one implementation, the error detector 308 may perform first level of error classification corresponding to different protocol layers based on the protocol supported by the device 208. For example, for the PCI express protocol, the error detector 308 may classify the error to correspond to the PHY layer, DL layer, TL layer or the MAC layer. In some embodiments, when the error is detected, the TLP header 502 corresponding to the transaction may be recorded in a packet header register (not shown). For example, the packet header register may be a proprietary register that can store the information associated with the TLP header 502 and any other relevant information about the packet. In some embodiments, the information stored in the packet header register can be used by the device firmware to determine the attributes associated with the error and perform a second level of error classification.

The interrupt generator 310 may be configured to generate an interrupt if an error is detected by the error detector 308. According to some embodiments, the interrupt may be sent to the processor 212 for processing by the software module 218. For example, the interrupt may be sent by the interrupt generator 310 to the processor 212 via an interrupt line or may be mapped into the address space of the processor 212. In some implementations, a plurality of interrupts from different sources may connect to an interrupt line of the processor 212 through an optional interrupt controller (not shown).

The configuration space registers 312 may include hardware registers mapped to memory locations to provide configuration space for any number of PFs implemented by the device 208. For example, the configuration space registers 312 may be part of the configuration space 110 as discussed with reference to FIG. 1. In some implementations, each function may include its own set of configuration registers. For example, the configuration space registers 312 may include BARs for each PF and other relevant configuration registers. The configuration space registers 312 may be defined based on the bus protocol supported by the device 208. Some embodiments can support enhanced configuration access mechanism (ECAM) for the PCI express protocol. For example, in some implementations, the configuration space registers 312 may include extended configuration space for PCI express parameters and capabilities.

Figure 4:
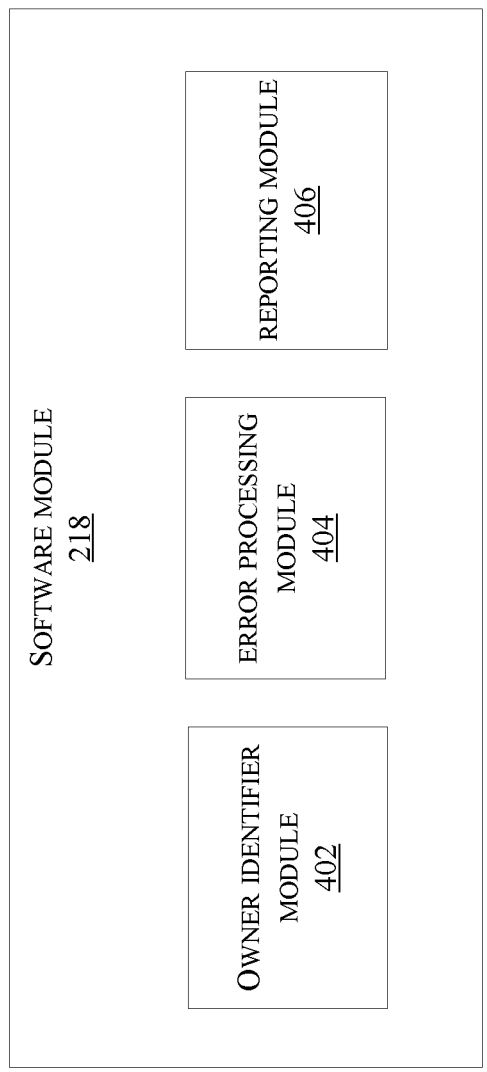
FIG. 4 illustrates a block diagram of a software module of the device, in one embodiment of the disclosed technologies.

FIG. 4 illustrates a block diagram showing components of the software module 218, in one embodiment. The software module 218 may include an owner identifier module 402, an error processing module 404 and a reporting module 406. Note that the block diagram as shown in FIG. 4 is for illustrative purposes only, and the software module 218 may include more or fewer components than shown in FIG. 4 without deviating from the scope of the disclosed technologies.

The owner identifier module 402 may be configured to identify an owner associated with the transaction. In some instances, the owner identifier module 402 may first determine a current state of the device upon receiving an interrupt from the hardware circuitry 210 before processing the transaction to identify the owner. For example, determining the current state of the device may include reading one or more registers in the device at a particular point in time. In some instances, the current state of the device may indicate a specific state that may not allow further processing of the transaction. For example, if the device state indicates a busy state of the processor 212 then the processing of the transaction can be ignored or postponed to a later point in time (e.g., when not busy). If the current state of the device allows processing of the transaction at that point in time, the owner identifier module 402 can proceed with processing the interrupt to identify the function associated with the transaction. For example, in some instances, the interrupt may be generated by the hardware circuitry 210 upon detecting an error associated with the transaction. The hardware circuitry 210 may have received a packet for the transaction from the host computer 202. The packet may be the TLP 500 as discussed with reference to FIG. 5A. In some implementations, the owner identifier module 402 may read the packet header register associated with the transaction to parse various fields of the packet header register, e.g., address, format, type, requester ID, completer ID, etc. The owner identifier module 402 may determine an identifier associated with the owner based on the one or more fields of the packet header register. As discussed with reference to FIG. 3, the packet header register may be written by the hardware circuitry 210 to log information associated with the packet.

In some implementations, the owner identifier module 402 may identify a function associated with the error based on the one or more fields of the packet header register. For example, the owner associated with the transaction can be a VF or a PF. In one implementation, the owner identifier module 402 may first determine a type of the transaction based on the format 506 and the type 508 fields. If the transaction type indicates a completion TLP, the owner identifier module 402 may use the requester ID from the packet header register to identify the function. If the transaction type is not a completion TLP, the owner identifier module 402 may compare an address from the address field of the packet header register with the BARs associated with the PFs and the VFs implemented by the device 208 to determine if the address lies within one of the BARs. If there is a match with one of the BARs, the PF or the VF associated with the matched BAR may be identified as the owner of the transaction. In some embodiments, an identifier associated with the owner can be represented using the bus/device/function, BDF or B/D/F. In some implementations, the software module 218 may also include an interrupt service routine or an interrupt handler to process the interrupt received from the hardware circuitry 210.

The error processing module 404 may be configured to determine attributes associated with the transaction that caused the interrupt. For example, in some instances, the cause of the interrupt may be the error associated with the transaction. The error processing module 404 may be further configured to perform a second level of error classification. For example, for PCI express protocol, the error processing module 404 may further classify the error corresponding to the transaction layer and the application layer. The error processing module 404 may further determine the attributes associated with the error based on the second level of error classification. In some embodiments, the attributes may include a type of the error and severity of the error. The type of the error may include a correctable error or an uncorrectable error. Correctable errors may include error conditions where the hardware can recover without any loss of information. Some non-limiting examples of the correctable errors may include a bad TLP or a bad DLLP. For example, the bad TLP may result from a bad LCRC (link cyclical redundancy check) or an incorrect sequence number, and the bad DLLP may result from a replay timer timeout or a receiver error (e.g., framing error). In some embodiments, the error processing module 404 may fix the correctable error without reporting the error. Uncorrectable errors may include error conditions that can impact functionality of the host interface 220. The uncorrectable errors may further be classified as fatal or nonfatal. The nonfatal uncorrectable errors can cause a particular transaction to be unreliable but the link may be otherwise fully operational. The fatal uncorrectable errors can render the particular link and related hardware unreliable. Some non-limiting examples of the uncorrectable nonfatal errors may include poisoned TLP received, unsupported request, completion timeout, completer abort, unexpected completion or ECRC failure. Some non-limiting examples of the uncorrectable nonfatal errors may include DLL protocol error, receiver overflow, flow control protocol error or malformed TLP.

The reporting module 406 may be configured to store the attributes and to store an identifier associated with the owner. For example, in some instances, the identifier associated with the owner, may be used to identify a VF or a PF associated with the transaction, e.g., using the bus/device/function. In some implementations, an identifier associated with a virtual function may be called a VF identifier and an identifier associated with a physical function may be called a PF identifier. Some embodiments can support baseline error reporting capability and advanced error reporting (AER) capability for a given function. In some embodiments, storing the attributes and the identifier for the given function may include exposing the attributes and the identifier in the PCI express capabilities or the AER capabilities for the given function using a PCI express configuration space. For example, in some instances, the reporting module 406 may be configured to expose the attributes associated with the error in both the PCI express capability and the AER capability for the given function using the PCI express configuration space.

Some embodiments of the disclosed technologies can support a PCI express capability structure to identify a type of the PCI express device function and also to provide access to PCI express specific control and status registers. In some embodiments, the reporting module 406 can populate relevant register fields in the PCI express capability structure to expose the attributes associated with the error and the function associated with the error. The PCI express capabilities, device capabilities, device status and device control registers required for all PCI express device functions among other registers can be stored in the configuration space 312 discussed with reference to FIG. 3, or as part of the emulated configuration registers discussed 216 with reference to FIG. 2. A PCI express capabilities register may be used to identify a PCI express device function type and associated capabilities. For example, a device/port type field in the PCI capability register can indicate a specific type of a given PCI express function, e.g., a PCI express endpoint, legacy PCI express endpoint, root port of PCI express root complex, etc. A device capability register may be used to identify PCI express device function specific capabilities. A device control register may be used to control PCI express device specific parameters. For example, the device control register may include respective reporting enable bits for each class of error (e.g., correctable, nonfatal or fatal) that may be used for error reporting of the corresponding error messages (e.g., ERR_COR, ERR_NONFATAL, ERR_FATAL, unsupported request errors). A device status register may be used to provide information about PCI express device (function) specific parameters. An example device status register is discussed with reference to FIG. 6.

Figure 6:
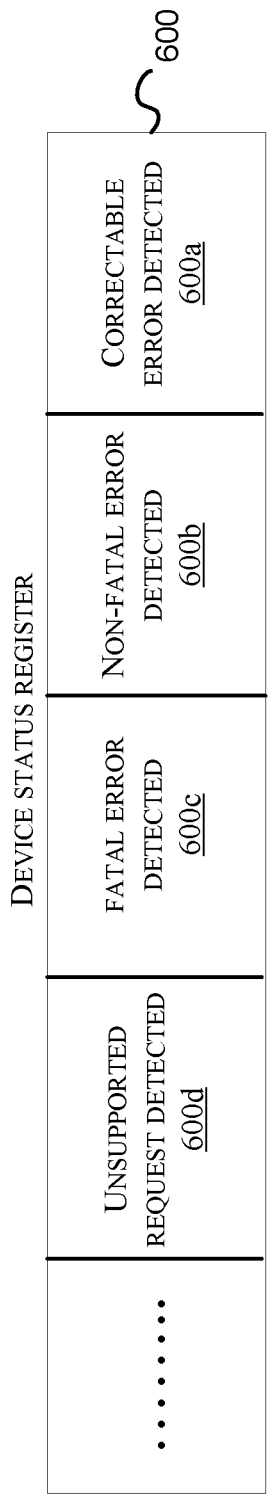
FIG. 6 illustrates an example device status register, in one embodiment of the disclosed technologies.

FIG. 6 illustrates an example device status register 600, in one embodiment of the disclosed technologies.

The device status register 600 may provide status of different types of errors detected by the hardware circuitry 210. The device status register 600 may include a correctable error detected 600*a* field, a nonfatal error detected 600*b* field, a fatal error detected 600*c* field, and an unsupported request detected 600*d* field, among other fields which are not shown here for the purposes of simplicity. The correctable error detected 600*a* field may indicate status of the correctable errors detected. The nonfatal error detected 600*b* field may indicate status of the nonfatal error detected. The fatal error detected 600*c* field may indicate status of the fatal error detected. The unsupported request detected 600*d* field may indicate that the function received an unsupported request. In some implementations, the errors may be logged in the device status register 600 regardless of whether error reporting is enabled or not for the respective error in the device control register for a specific function.

Some embodiments of the disclosed technologies can support advanced error reporting capability of PCI express device functions for reporting error to the host computer 202. For example, referring back to FIG. 4, in some embodiments, the reporting module 406 may also be configured to store the function identifier and the attributes associated with the transaction using the PCI express advanced error reporting extended capability. An example PCI express advanced error reporting extended capability structure is shown in FIG. 7.

Figure 7:
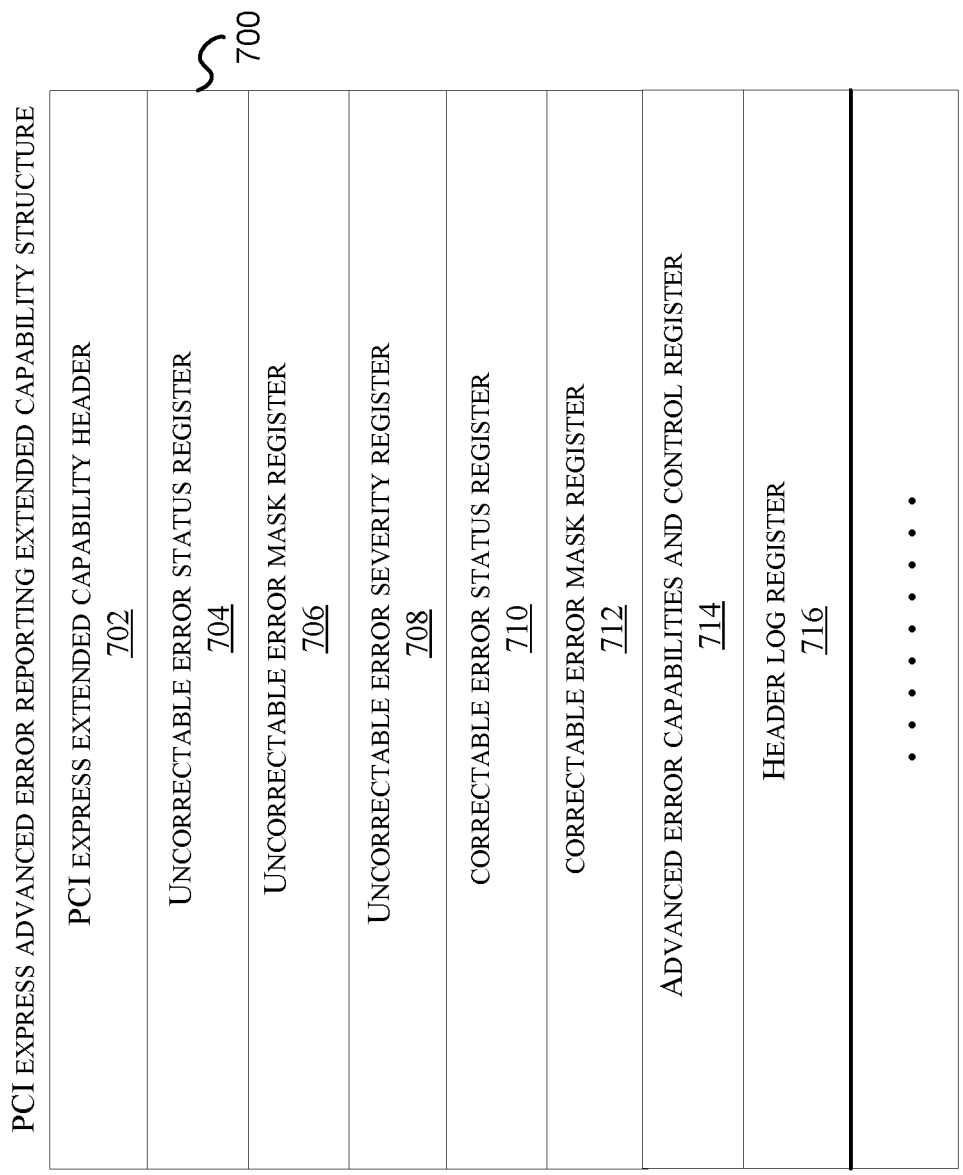
FIG. 7 illustrates a peripheral component interconnect (PCI) express advanced error reporting (AER) extended capability structure, in one embodiment of the disclosed technologies.

FIG. 7 illustrates a PCI express advanced error reporting extended capability structure 700, in one embodiment of the disclosed technologies. The PCI express advanced error reporting extended capability structure 700 may include a PCI express extended capability header 702, an uncorrectable error status register 704, an uncorrectable error mask register 706, an uncorrectable error severity register 708, a correctable error status register 710, a correctable error mask register 712, an advanced error capabilities and control register 714 and a header log register 716. Note that the PCI express advanced error reporting extended capability structure 700 may include other registers which are not shown here for the purposes of simplicity.

The PCI express extended capability header 702 may include a PCI express extended capability identifier to indicate the nature and format of the extended capability. In some implementations, an extended capability identifier in the PCI express extended capability header 702 may be set to "0001h" to indicate advanced error reporting capability.

The uncorrectable error status register 704 may indicate error detection status of individual errors on a PCI Express device function using respective status bits. An individual error status bit that is set may indicate that a particular error was detected. Some examples of the uncorrectable error status bits may include poisoned TLP status, completion timeout status, completer abort status, malformed TLP status, receiver overflow status, uncorrectable internal error status, etc.

The uncorrectable error mask register 706 may be used to control reporting of individual errors by the device function to the host computer 202 via a PCI express error message. The uncorrectable error mask register 706 may include a mask bit per error bit of the uncorrectable error status register 704. A masked error (i.e., respective bit set in the uncorrectable error mask register 706) may not be reported to the host computer 202 and may not be recorded in the header log register 716.

The uncorrectable error severity register 708 can be configured to control whether an individual error is reported as a nonfatal error or fatal error. For device functions implementing the AER capability, the uncorrectable error severity register 708 can allow each uncorrectable error to be programmed as fatal or nonfatal. For example, an error can be reported as fatal when the corresponding error bit in the uncorrectable error severity register 708 is set. If the bit is clear, the corresponding error can be considered nonfatal.

The correctable error status register 710 may be configured to report error status of individual correctable error sources on a PCI express device function. When an individual error status bit is set, it may indicate that a particular error occurred. Some examples of the correctable error status bits may include receiver error status, bad TLP status, bad DLLP status, corrected internal error status, etc.

The correctable error mask register 712 may be used to control reporting of individual correctable errors by the device function to the host computer 202 via a PCI express error message. The correctable error mask register 712 may include a mask bit per error bit of the correctable error status register 710. A masked error (i.e., respective bit set in the correctable error mask register 712) may not be reported to the host computer 202.

The advanced error capabilities and control register 714 may include controls for ECRC generation and checking and multiple header recording among other fields.

The header log register 716 may contain the header for the TLP corresponding to a detected error. In some embodiments, the header log register 716 may expose some of the information associated with the transaction that was stored in the packet header register by the hardware circuitry 210 upon detecting an error.

Referring back to FIG. 4, in some embodiments, the reporting module 406 may be configured to populate various fields of the relevant AER capabilities in the PCI express advanced error reporting extended capability structure 700 based on the attributes associated with the transaction, e.g., the error classification corresponding to the protocol layer, error type and severity, for the given function. For example, if the detected error is an "unsupported request error", the reporting module 406 may set an "unsupported request error status" bit in the uncorrectable error status register 704 and an "unsupported request error severity" bit in the uncorrectable error severity register 708 to indicate a type and severity of the error associated with a VF or PF identified by the owner identifier module 402. In some embodiments, the PCI express advanced error reporting extended capability structure 700 can be stored in the configuration space 312 discussed with reference to FIG. 3 or as part of the emulated configuration registers discussed 216 with reference to FIG. 2. Thus, in different embodiments, exposing various attributes associated with the transaction using the device software/firmware can provide a flexible approach as compared to hardware only approach since software can be easily upgraded for implementing additional VFs, different configurations, feature upgrades, bug fixes, etc. In addition, the embodiments of the disclosed technology can allow live updates or configuration of various registers in the PCI express capability structure (not shown) or the PCI express advanced error reporting extended capability structure 700 by implementing the PCI express capabilities in software. Furthermore, some embodiments can allow addition of new error types in the AER extended capabilities without modifying the device hardware. For example, the new error types can be added to the reserved fields in the appropriate status and severity registers. Additionally, when a new PCI express engineering change notice (ECN) is released; the embodiments may be able to support the PCI express protocol to provide hybrid report management without requiring modification of the device hardware.

In some embodiments, the reporting module 406 may also be configured to report an error to the root complex or the host processor 204 using an error message transaction. For example, the reporting module 406 may provide the relevant error information associated with the transaction to the hardware circuitry 210 that can be used to generate the error message transaction. For example, the relevant error information may be obtained from the PCI express AER extended capability structure 700, as discussed with reference to FIG. 7. An example message transaction is shown in FIG. 8A.

Figure 8:
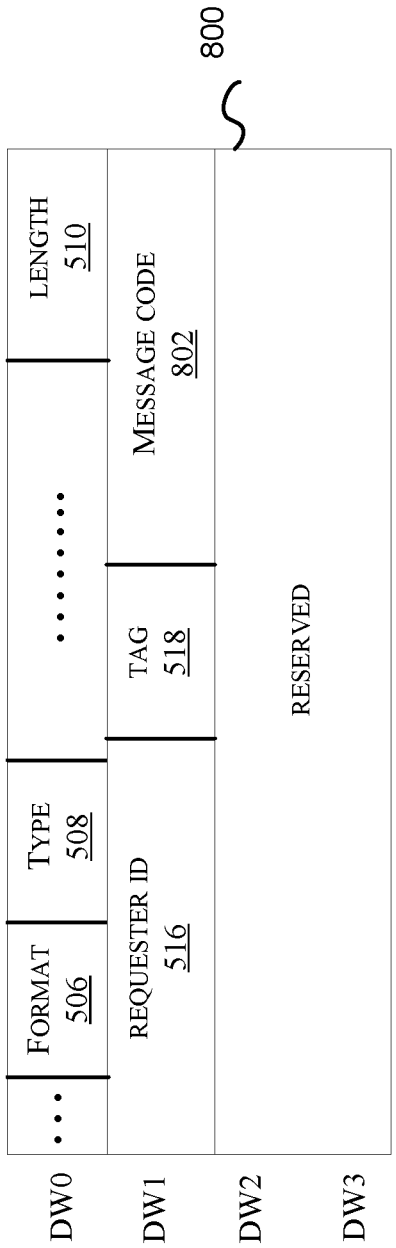
FIG. 8A illustrates a TLP header for a message transaction, in one embodiment.
FIG. 8B illustrates a table showing different error types corresponding to the message code for reporting detection of errors based on the severity of the error, in one embodiment.

FIG. 8A illustrates a TLP header 800 for a message transaction, in one embodiment. Referring back to FIG. 3, the message transaction comprising the TLP header 800 may be sent by the transaction interface manager 306 to the host computer 202 via the host interface 220. The TLP header 800 may include a message code 802 in addition to the format 506, type 508, length 510, requester ID 516 and the tag 518, as discussed with reference to FIG. 5B. Note that the DW2 and DW3 for the TLP header 800 may be reserved. The requester ID 516 field may include the requester's bus number, device number and the function number that can uniquely identify the requester. For example, the function number in the requester ID 516 may include the VF identifier or the PF identifier identified by the owner identifier module 402 that can be used to identify the function associated with the error. The message code 802 may also identify an error type as shown in FIG. 8B.

FIG. 8B illustrates a table 804 showing different error types corresponding to the message code 802, in one embodiment.

The table 804 shows an error type 806 corresponding to the message code 802. The error type 806 may correspond to the severity of the detected error. For example, the message code "0011 0000" may indicate that an "ERR_COR" message is issued upon detecting a correctable error associated with a given function identified by the requester ID 516. The message code "0011 0001" may indicate that an "ERR_NONFATAL" message is issued upon detecting a nonfatal uncorrectable error associated with a given function identified by the requester ID 516. The message code "0011 0011" may indicate that an "ERR_FATAL" message is issued upon detecting a fatal uncorrectable error associated with a given function identified by the requester ID 516. The reporting module 406 may be configured to provide the message code 802 based on the error type 806.

The host computer 202 may be configured to receive the message transaction from the device 208 associated with the error. In some instances, the host computer 202 may associate the error to a fault function associated with the hypervisor executing on the host processor 204. For example, the fault function may correspond to the VF or the PF associated with the transaction.

Figure 9:
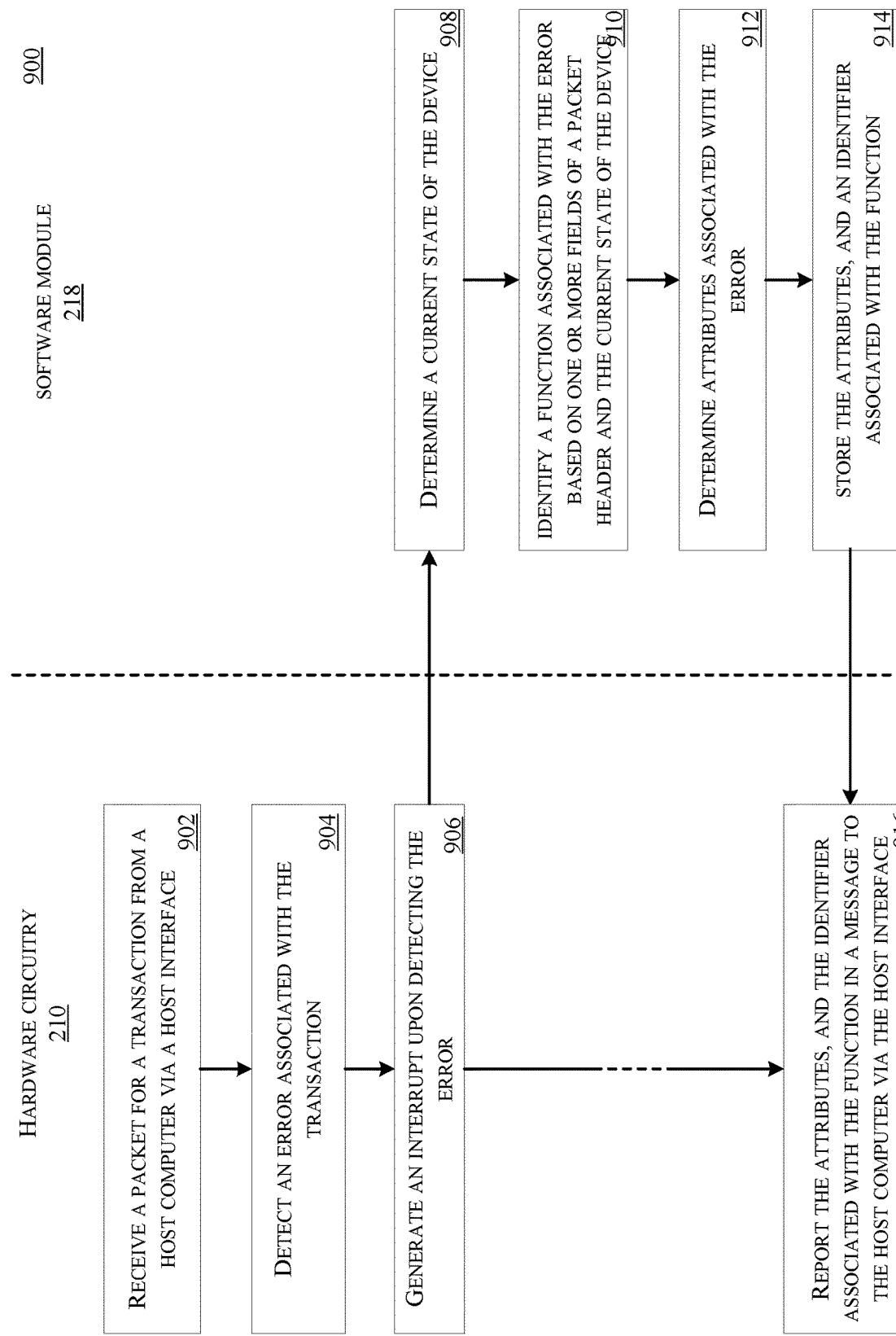
FIG. 9 illustrates a method for error reporting management using hardware circuitry and a software module of the device, in one embodiment.

FIG. 9 illustrates a method 900 for error reporting management using the hardware circuitry 210 and the software module 218, in one embodiment.

In step 902, the hardware circuitry 210 may receive a packet for a transaction from a host computer 202 via a host interface 220. In some embodiments, the packet may include the TLP 500 comprising the TLP header 502. The host interface 220 may include a PCI express interface. Referring back to FIG. 3, the TLP packet 500 may be received by the transaction interface manager 306. The transaction may include a memory transaction, an I/O transaction or a configuration transaction.

In step 904, the hardware circuitry 210 may detect an error associated with the transaction. Referring back to FIG. 3, the error detector 308 may detect an error associated with the transaction and may perform a first level error classification. For example, the error detector 308 may classify the error corresponding to the PHY layer, DL layer, TL layer or the MAC layer. In some embodiments, when the error is detected, information from the TLP header 502 associated with the transaction and the first level error classification may be recorded in a packet header register.

In step 906, the hardware circuitry 210 may generate an interrupt upon detecting the error associated with the transaction. Referring back to FIG. 3, the interrupt generator 310 may generate an interrupt upon detecting the error by the error detector 308. The interrupt may be sent to the processor 212 for processing by the software module 218.

In step 908, the software module 218 may determine a current state of the device. Referring back to FIG. 4, the owner identifier module 402 may determine a current state of the device upon receiving the interrupt from the hardware circuitry 210. For example, determining the current state of the device may include reading one or more registers in the device at a particular point in time.

In step 910, the software module 218 may identify a function associated with the error based on the one or more fields of the packet header and the current state of the device. Referring back to FIG. 4, the current state of the device may indicate a specific state that may or may not allow error processing. For example, if the device state indicates a busy state of the processor 212 then the error processing can be ignored or postponed to a later point in time (e.g., when not busy). If the current state of the device allows error processing at that point in time, the owner identifier module 402 can proceed with processing the error to identify the function associated with the error. The owner identifier module 402 may identify the function by reading the packet header register that may have recorded information associated with the TLP header 502 for the transaction with the error. For example, the owner identifier module 402 may read a requester ID and address fields of the packet header register and compare with the BARs associated with different PFs and VFs to identify the PF or the VF associated with the error. For example, in one instance, the address of the transaction can be 0xF4000010 and the BARs associated with different PFs and VFs may include [0xF1000000-0xF1200000], [0xF2000000-0xF2200000], [0xF3000000-0xF3100000] and [0xF4000000-0xF4100000]. The owner identifier module 402 may compare the address of the transaction with the BARs and determine that the function associated with the transaction is the PF or the VF corresponding to the BAR [0xF4000000-0xF4100000], since the address (e.g., 0xF4000010) lies within [0xF4000000-0xF4100000].

In step 912, the software module 218 may determine attributes associated with the error. For example, the attributes may include an error type or severity of the error. Referring back to FIG. 4, the error processing module 404 may classify the error to be the correctable error type or the uncorrectable error type. In some embodiments, the error processing module 404 may fix the correctable error without reporting the error. The error processing module 404 may further classify the uncorrectable error for severity as fatal or nonfatal uncorrectable error. In some embodiments, the error processing module 404 may classify the error based on the protocol layer, e.g., PHY layer, TL layer, MAC layer, DL layer.

In step 914, the software module 218 may store the attributes and an identifier associated with the function. Referring back to FIG. 4, the reporting module 406 may log the attributes of the error in the appropriate status register based on the type and severity of the detected error. For example, with reference to FIG. 6, the detected error may be logged in the device status register 600 for the functions supporting the PCI express capabilities. In addition or alternatively, as discussed with reference to FIG. 7, the detected error may be logged in the uncorrectable error status register 704 or the correctable error status register 710, as appropriate, for the functions supporting the AER capabilities. Further, severity of the uncorrectable error may be logged in the uncorrectable error severity register 708.

In step 916, the hardware circuitry 210 may report the attributes and the identifier associated with the function in a message to the host computer via the host interface. As discussed with reference to FIG. 8A, a TLP message transaction comprising the TLP header 800 may be sent to the host computer 202 via the host interface 220. The requester ID 516 may include a VF identifier or the PF identifier to identify the function associated with the error. The message code 802 may indicate the appropriate error type 806 for the detected error. In some instances, the host computer 202 may associate the error to a fault function associated with the hypervisor executing on the host processor 204.

Even though the embodiments have been discussed for hybrid hardware and software reporting of the error attributes, it will be noted that the embodiments can be used for hybrid hardware and software reporting of other functionalities, e.g., power management, without deviating from the scope of the disclosed technologies. For example, some embodiments of the disclosed technologies can be used to enable the device software to assist with classification of power level states for each emulated function once the device hardware implements transitions of actual hardware states as instructed by the firmware. Thus, the embodiments can provide a more flexible approach for report management by allowing live updates and ease of implementation with the use of software as compared to hardware only approach. In addition, this hybrid approach can be easily scaled to any number of functions without modifying the hardware, thus providing a cost effective solution.

Figure 10:
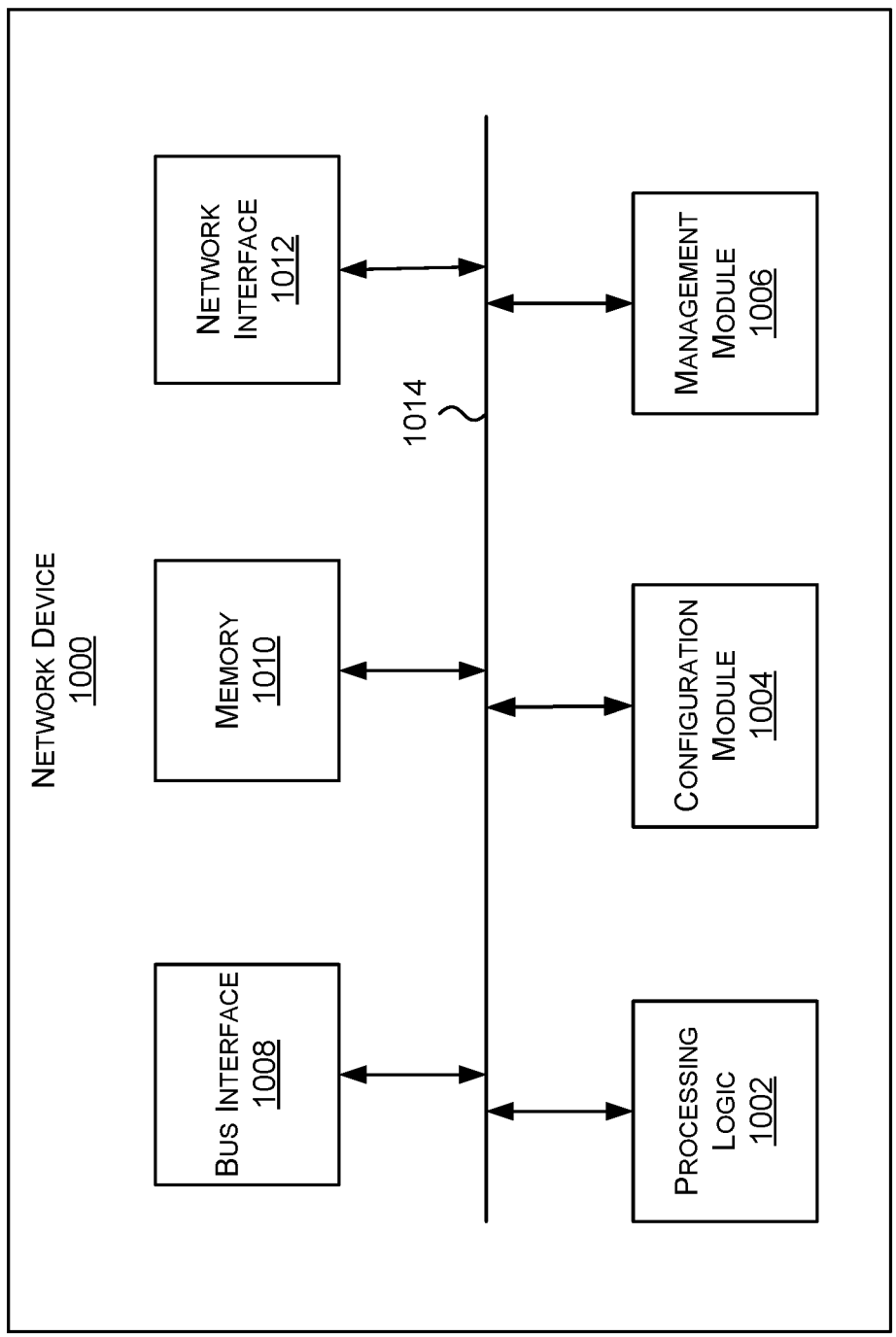
FIG. 10 illustrates an example of a network device, according to certain aspects of the disclosure.

FIG. 10 illustrates an example of a network device 1000. Functionality and/or several components of the network device 1000 may be used without limitation with other embodiments disclosed elsewhere in this disclosure, without limitations. In some embodiments, the network device 1000 may utilize functionalities and/or several components of the device 208. A network device 1000 may facilitate processing of packets and/or forwarding of packets from the network device 1000 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the network device 1000 may be the recipient and/or generator of packets. In some implementations, the network device 1000 may modify the contents of the packet before forwarding the packet to another device. The network device 1000 may be a peripheral device coupled to another computer device, a switch, a router or any other suitable device enabled for receiving and forwarding packets.

In one example, the network device 1000 may include processing logic 1002, a configuration module 1004, a management module 1006, a bus interface module 1008, memory 1010, and a network interface module 1012. These modules may be hardware modules, software modules, or a combination of hardware and software. In certain instances, modules may be interchangeably used with components or engines, without deviating from the scope of the disclosure. The network device 1000 may include additional modules, not illustrated here, such as components discussed with respect to the nodes disclosed in FIG. 11. In some implementations, the network device 1000 may include fewer modules. In some implementations, one or more of the modules may be combined into one module. One or more of the modules may be in communication with each other over a communication channel 1014. The communication channel 1014 may include one or more busses, meshes, matrices, fabrics, a combination of these communication channels, or some other suitable communication channel.

The processing logic 1002 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1002 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1002 may be stored on a computer-readable storage medium, for example, in the form of a computer program. The computer-readable storage medium may be non-transitory. In some cases, the computer-readable medium may be part of the memory 1010. In some cases, instructions from the software module 218 may be stored in the memory 1010 as part of the computer-readable medium.

The memory 1010 may include either volatile or non-volatile, or both volatile and non-volatile types of memory. The memory 1010 may, for example, include random access memory (RAM), read only memory (ROM), Electrically Erasable Programmable Read-Only Memory (EEPROM), flash memory, and/or some other suitable storage media. In some cases, some or all of the memory 1010 may be internal to the network device 1000, while in other cases some or all of the memory may be external to the network device 1000. The memory 1010 may store an operating system comprising executable instructions that, when executed by the processing logic 1002, provides the execution environment for executing instructions providing networking functionality for the network device 1000. The memory may also store and maintain several data structures and routing tables for facilitating the functionality of the network device 1000.

In some implementations, the configuration module 1004 may include one or more configuration registers. Configuration registers may control the operations of the network device 1000. In some implementations, one or more bits in the configuration register can represent certain capabilities of the network device 1000. Configuration registers may be programmed by instructions executing in the processing logic 1002, and/or by an external entity, such as a host device, an operating system executing on a host device, and/or a remote device. The configuration module 1004 may further include hardware and/or software that control the operations of the network device 1000.

In some implementations, the management module 1006 may be configured to manage different components of the network device 1000. In some cases, the management module 1006 may configure one or more bits in one or more configuration registers at power up, to enable or disable certain capabilities of the network device 1000. In certain implementations, the management module 1006 may use processing resources from the processing logic 1002. In other implementations, the management module 1006 may have processing logic similar to the processing logic 1002, but segmented away or implemented on a different power plane than the processing logic 1002.

The bus interface module 1008 may enable communication with external entities, such as a host device and/or other components in a computing system, over an external communication medium. The bus interface module 1008 may include a physical interface for connecting to a cable, socket, port, or other connection to the external communication medium. The bus interface module 1008 may further include hardware and/or software to manage incoming and outgoing transactions. The bus interface module 1008 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1008 may include the physical layer for any of these bus protocols, including a connector, power management, and error handling, among other things. In some implementations, the network device 1000 may include multiple bus interface modules for communicating with multiple external entities. These multiple bus interface modules may implement the same local bus protocol, different local bus protocols, or a combination of the same and different bus protocols.

The network interface module 1012 may include hardware and/or software for communicating with a network. This network interface module 1012 may, for example, include physical connectors or physical ports for wired connection to a network, and/or antennas for wireless communication to a network. The network interface module 1012 may further include hardware and/or software configured to implement a network protocol stack. The network interface module 1012 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the network device 1000 may include multiple network interface modules, each configured to communicate with a different network. For example, in these implementations, the network device 1000 may include a network interface module for communicating with a wired Ethernet network, a wireless 802.11 network, a cellular network, an Infiniband network, etc.

The various components and modules of the network device 1000, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 11.

Figure 11:
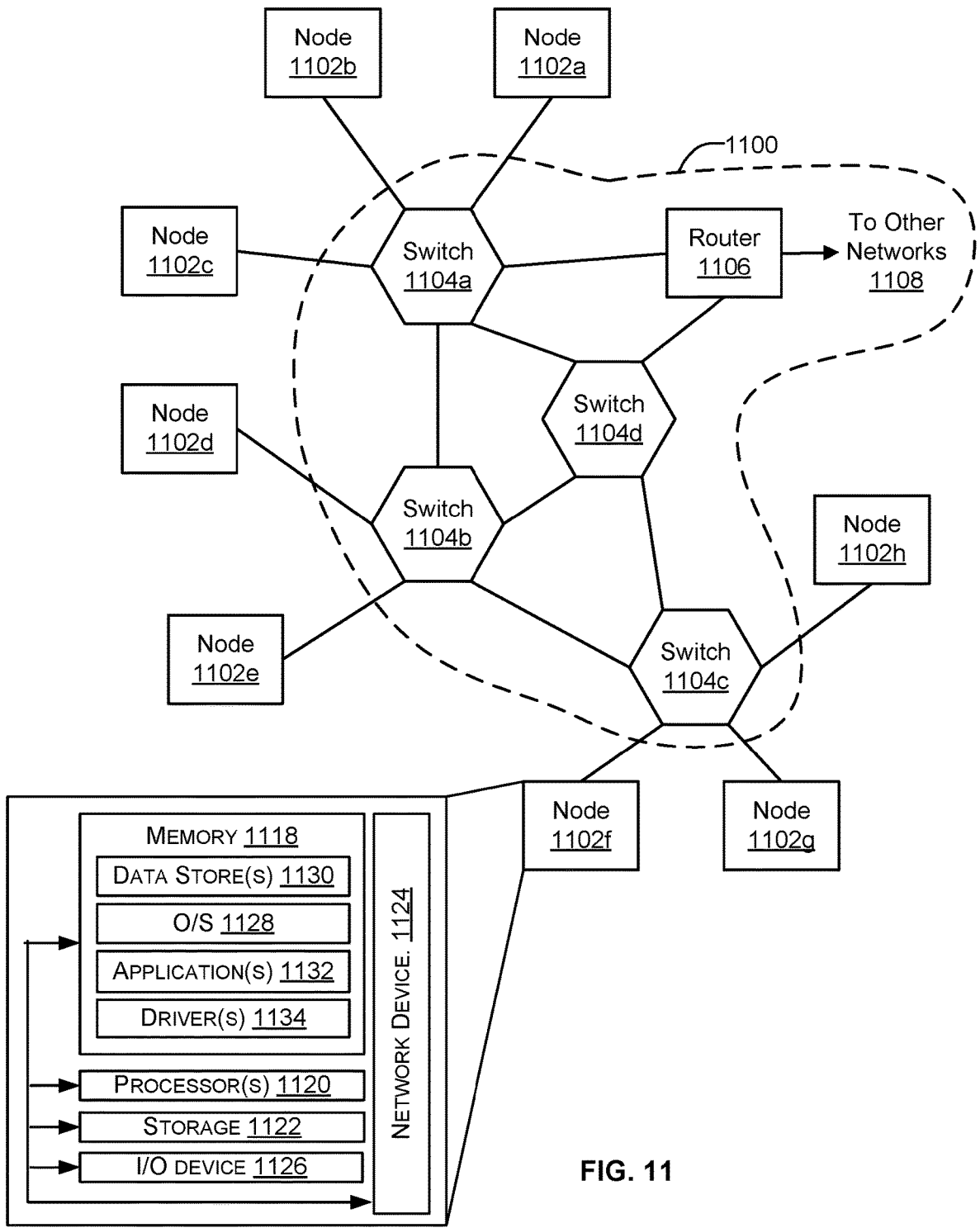
FIG. 11 illustrates an example architecture for features and systems described herein that includes one or more service provider computers and/or a user device connected via one or more networks, according to certain aspects of the disclosure.

FIG. 11 illustrates a network 1100, illustrating various different types of network devices 1000 of FIG. 10, such as nodes comprising the network device, switches and routers. In certain embodiments, the network 1100 may be based on a switched architecture with point-to-point links. As illustrated in FIG. 11, the network 1100 includes a plurality of switches 1104*a*-1104*d*, which may be arranged in a network. In some cases, the switches are arranged in a multi-layered network, such as a Clos network. A network device 1000 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 1104*a*-1104*d* may be connected to a plurality of nodes 1102*a*-1102*h* and provide multiple paths between any two nodes.

The network 1100 may also include one or more network devices 1000 for connection with other networks 1108, such as other subnets, LANs, wide area networks (WANs), or the Internet, and may be referred to as routers 1106. Routers use headers and forwarding tables to determine the best path for forwarding the packets, and use protocols such as internet control message protocol (ICMP) to communicate with each other and configure the best route between any two devices.

In some examples, network(s) 1100 may include any one or a combination of many different types of networks, such as cable networks, the Internet, wireless networks, cellular networks and other private and/or public networks. Interconnected switches 1104*a*-1104*d* and router 1106, if present, may be referred to as a switch fabric, a fabric, a network fabric, or simply a network. In the context of a computer network, terms "fabric" and "network" may be used interchangeably herein.

Nodes 1102*a*-1102*h* may be any combination of host systems, processor nodes, storage subsystems, and I/O chassis that represent user devices, service provider computers or third party computers.

User devices may include computing devices to access an application 1132 (e.g., a web browser or mobile device application). In some aspects, the application 1132 may be hosted, managed, and/or provided by a computing resources service or service provider. The application 1132 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 1108. Additionally, the user device(s) may be part of the distributed system managed by, controlled by, or otherwise part of the service provider computer(s) (e.g., a console device integrated with the service provider computers).

The node(s) of FIG. 11 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s)

may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 1132 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 1102a-1102h may include at least one memory 1118 and one or more processing units (or processor(s) 1120). The processor(s) 1120 may be implemented in hardware, computer-executable instructions, firmware, or combinations thereof. Computer-executable instruction or firmware implementations of the processor(s) 1120 may include computer-executable or machine-executable instructions written in any suitable programming language to perform the various functions described.

In some instances, the hardware processor(s) 1120 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 1118 may store program instructions that are loadable and executable on the processor(s) 1120, as well as data generated during the execution of these programs. Depending on the configuration and type of the node(s) 1102a-1102h, the memory 1118 may be volatile (such as RAM) and/or non-volatile (such as ROM, flash memory, etc.). The memory 1118 may include an operating system 1128, one or more data stores 1130, one or more application programs 1132, one or more drivers 1134, and/or services for implementing the features disclosed herein.

The operating system 1128 may support nodes 1102a-1102h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 1128 may also be a proprietary operating system.

The data stores 1130 may include permanent or transitory data used and/or operated on by the operating system 1128, application programs 1132, or drivers 1134. Examples of such data include web pages, video data, audio data, images, user data, and so on. The information in the data stores 1130 may, in some implementations, be provided over the network(s) 1108 to user devices 1104. In some cases, the data stores 1130 may additionally or alternatively include stored application programs and/or drivers. Alternatively or additionally, the data stores 1130 may store standard and/or proprietary software libraries, and/or standard and/or proprietary application user interface (API) libraries. Information stored in the data stores 1130 may be machine-readable object code, source code, interpreted code, or intermediate code.

The drivers 1134 include programs that may provide communication between components in a node. For example, some drivers 1134 may provide communication between the operating system 1128 and additional storage 1122, network device 1124, and/or I/O device 1126. Alternatively or additionally, some drivers 1134 may provide communication between application programs 1132 and the operating system 1128, and/or application programs 1132 and peripheral devices accessible to the service provider computer. In many cases, the drivers 1134 may include drivers that provide well-understood functionality (e.g., printer drivers, display drivers, hard disk drivers, Solid State Device drivers). In other cases, the drivers 1134 may provide proprietary or specialized functionality.

The service provider computer(s) or servers may also include additional storage 1122, which may include removable storage and/or non-removable storage. The additional storage 1122 may include magnetic storage, optical disks, solid state disks, flash memory, and/or tape storage. The additional storage 1122 may be housed in the same chassis as the node(s) 1102a-1102h or may be in an external enclosure. The memory 1118 and/or additional storage 1122 and their associated computer-readable media may provide non-volatile storage of computer-readable instructions, data structures, program modules, and other data for the computing devices. In some implementations, the memory 1118 may include multiple different types of memory, such as SRAM, DRAM, or ROM.

The memory 1118 and the additional storage 1122, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 1118 and the additional storage 1122 are examples of computer storage media. Additional types of computer storage media that may be present in the node(s) 1102a-1102h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 1102a-1102h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 1102a-1102h may also include I/O device(s) 1126, such as a keyboard, a mouse, a pen, a voice input device, a touch input device, a display, speakers, a printer, and the like. The node(s) 1102a-1102h may also include one or more communication channels 1136. A communication channel 1136 may provide a medium over which the various components of the node(s) 1102a-1102h can communicate. The communication channel or channels 1136 may take the form of a bus, a ring, a switching fabric, or a network.

The node(s) 1102a-1102h may also contain network device(s) 1124 that allow the node(s) 1102a-1102h to communicate with a stored database, another computing device or server, user terminals and/or other devices on the network(s) 1100. The network device(s) 1124 of FIG. 11 may include similar components discussed with reference to the network device 1000 of FIG. 10.

In some implementations, the network device 1124 is a peripheral device, such as a PCI-based device. In these implementations, the network device 1124 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 1008 may implement NVMe, and the network device 1124 may be connected to a computing system using a PCIe interface.

A PCI-based device may include one or more functions. A "function" describes operations that may be provided by the network device 1124. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 1124 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 10, FIG. 11, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A device, comprising:
   hardware circuitry configured to generate an interrupt upon detecting an error in a packet received from a host computer, the packet being received via a host interface and being associated with a transaction;
   memory storing instructions or data that implement an emulated configuration register in the memory, the emulated configuration register emulating a hardware configuration register and being reconfigurable to add or remove capabilities for a function associated with an address space of the emulated configuration register; and
   a processor communicatively coupled to the hardware circuitry, the processor configured to execute instructions stored in the memory that cause the processor to, in response to receiving the interrupt:
   determine, based on a header of the packet, that the transaction is directed to the address space of the emulated configuration register;
   identify, based on the determining that the transaction is directed to the address space of the emulated configuration register, the function as being associated with the error;
   determine attributes associated with the error; and
   store, in a location accessible to the hardware circuitry, the attributes and an identifier associated with the function,
   wherein the hardware circuitry is further configured to report the attributes and the identifier associated with the function in a message to the host computer via the host interface.

2. The device of claim 1, wherein the address space of the emulated configuration register is part of a configuration space that includes a hardware register, the hardware register and the emulated configuration register being memory mapped to an address space of the host computer.

3. The device of claim 2, wherein the configuration space is a peripheral component interconnect (PCI) express configuration space, and wherein the host interface includes a PCI express interface through which the device is exposed to the host computer as a PCI express device.

4. A device, comprising:
   hardware circuitry configured to:
   receive a packet for a transaction from a host computer communicatively coupled to the device;
   detect an error associated with the transaction, wherein the error is detected based on the received packet; and
   generate an interrupt upon detecting the error;
   memory storing instructions; and
   a processor communicatively coupled to the hardware circuitry, wherein when executed by the processor, the instructions cause the processor to:
   determine, based on the packet, that the transaction is directed to an address space of an emulated configuration register, the emulated configuration register emulating a hardware configuration register and containing information indicative of capabilities of a function associated with the address space of the emulated configuration register;
   identify, based on the determining that the transaction is directed to the address space of the emulated configuration register, the function as being associated with the error;
   determine attributes associated with the error; and
   store, in a location accessible to the hardware circuitry, the attributes and an identifier associated with the function.

5. The device of claim 4, wherein the address space of the emulated configuration register is part of a configuration space that includes a hardware configuration register, the hardware configuration register and the emulated configuration register being memory mapped to an address space of the host computer.

6. The device of claim 5, wherein the hardware configuration register is part of the hardware circuitry.

7. The device of claim 5, wherein the configuration space is a peripheral component interconnect (PCI) express configuration space, and wherein the device further comprises a host interface through which the device is exposed to the host computer as a PCI express device.

8. The device of claim 7, wherein the function associated with the emulated configuration register is an addressable entity in the PCI express configuration space.

9. The device of claim 4, wherein the attributes and the identifier associated with the function are stored in additional emulated configuration registers that emulate Advanced Error Reporting (AER) capability registers.

10. The device of claim 4, wherein the hardware circuitry is configured to:
    access the location in which the attributes and the identifier associated with the function are stored; and
    report the attributes and the identifier associated with the function to the host computer.

11. The device of claim 10, wherein the hardware circuitry reports the attributes and the identifier associated with the function using a transaction layer packet (TLP) message.

12. The device of claim 4, wherein the function associated with the emulated configuration register is a virtual function.

13. The device of claim 4, wherein the hardware circuitry is configured to classify the error based on a peripheral component interconnect (PCI) express protocol layer to which the error corresponds.

14. The device of claim 13, wherein the hardware circuitry classifies the error as corresponding to a physical layer, a data link layer, a transaction layer, or a media access control (MAC) layer.

15. The device of claim 4, wherein the determining that the transaction is directed to the address space of the emulated configuration register is performed based on determining, from a header of the packet, that the packet is not a completion transaction layer packet (TLP).

16. A computer-implemented method comprising:
receiving, by a processor on a device, an interrupt from hardware circuitry on the device, wherein the interrupt is generated by the hardware circuitry upon detecting an error on a packet for a transaction, and wherein the packet is received from a host computer;
implementing an emulated configuration register based on information stored in a memory of the device, the emulated configuration register emulating a hardware configuration register and containing information indicative of capabilities of a function associated with an address space of the emulated configuration register; and
in response to the receiving of the interrupt:
determining, by the processor and based on the packet, that the transaction is directed to the address space of the emulated configuration register;
identifying, by the processor and based on the determining that the transaction is directed to the address space of the emulated configuration register, the function as being associated with the error;
determining, by the processor, attributes associated with the error; and
storing, by the processor, the attributes and an identifier associated with the function in a location accessible to the hardware circuitry.

17. The method of claim 16, further comprising:
reporting, using the hardware circuitry, the attributes and the identifier associated with the function to the host computer.

18. The method of claim 16, wherein the attributes and the identifier associated with the function are stored in additional emulated configuration registers that emulate Advanced Error Reporting (AER) capability registers.

19. The method of claim 16, wherein the address space of the emulated configuration register is part of a configuration space that includes a hardware configuration register, the hardware configuration register and the emulated configuration register being memory mapped to an address space of the host computer.

20. The method of claim 16, further comprising:
determining, by the processor and from a header of the packet, that the packet is not a completion transaction layer packet (TLP), wherein the determining that the transaction is directed to the address space of the emulated configuration register is performed based on the determining that the packet is not a completion TLP.

* * * * *